United States Patent
Gaben

(10) Patent No.: US 10,026,821 B2
(45) Date of Patent: Jul. 17, 2018

(54) ALL-AROUND GATE FIELD-EFFECT TRANSISTOR

(71) Applicant: STMicroelectronics (Crolles 2) SAS, Crolles (FR)

(72) Inventor: Loic Gaben, Busque (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/467,082

(22) Filed: Mar. 23, 2017

(65) Prior Publication Data

US 2018/0061955 A1    Mar. 1, 2018

(30) Foreign Application Priority Data

Aug. 30, 2016 (FR) ..................... 16 58042
Aug. 30, 2016 (FR) ..................... 16 58043

(51) Int. Cl.
*H01L 29/78* (2006.01)
*H01L 29/66* (2006.01)
*H01L 29/423* (2006.01)
*H01L 29/06* (2006.01)

(52) U.S. Cl.
CPC .... *H01L 29/42392* (2013.01); *H01L 29/0653* (2013.01); *H01L 29/0673* (2013.01); *H01L 29/42356* (2013.01); *H01L 29/6653* (2013.01); *H01L 29/6681* (2013.01); *H01L 29/66545* (2013.01); *H01L 29/66553* (2013.01); *H01L 29/7853* (2013.01)

(58) Field of Classification Search
CPC ..... H01L 29/06; H01L 29/065; H01L 29/067; H01L 29/0653; H01L 29/0673; H01L 29/42; H01L 29/423; H01L 29/4239; H01L 29/4235; H01L 29/42356; H01L 29/42392; H01L 29/66; H01L 29/665; H01L 29/6654; H01L 29/6655; H01L 29/66545; H01L 29/66553; H01L 29/668; H01L 29/6681; H01L 29/78; H01L 29/785; H01L 29/7853
USPC ......................................... 257/29
See application file for complete search history.

(56) References Cited

U.S. PATENT DOCUMENTS

| | | |
|---|---|---|
| 2003/0042568 A1 | 3/2003 | Jang |
| 2007/0181959 A1 | 8/2007 | Park et al. |
| 2013/0175503 A1* | 7/2013 | Cohen ............... H01L 29/66439 257/29 |

FOREIGN PATENT DOCUMENTS

WO    WO-2013101230 A1    7/2013

OTHER PUBLICATIONS

INPI Search Report and Written Opinion for FR 1658042 dated Apr. 25, 2017 (7 pages).

(Continued)

*Primary Examiner* — Monica D Harrison
(74) *Attorney, Agent, or Firm* — Crowe & Dunlevy

(57) ABSTRACT

An all-around gate field-effect transistor includes two drain-source areas supported by a semiconductor substrate. At least one channel region, surrounded with a gate insulated by a gate insulator, extends between the two drain-source areas. The at least one channel region is located above an insulating layer resting on the substrate and positioned between the two drain-source areas. This insulating layer has a thickness-to-permittivity ratio at least 2 times greater than that of the gate insulator. An extension of the insulating layer is positioned to insulate at least one of the channel regions from the semiconductor substrate.

26 Claims, 8 Drawing Sheets

(56) References Cited

OTHER PUBLICATIONS

INPI Search Report and Written Opinion for FR 1658043 dated May 12, 2017 (7 pages).
L Gaben et al. "Evaluation of Stacked Nanowires Transistors for CMOS: Performance and Technology Opportunities" ECS Transactions, vol. 72. No. 4, 2016.

\* cited by examiner

ALL-AROUND GATE FIELD-EFFECT TRANSISTOR

PRIORITY CLAIM

This application claims the priority benefit of French Application for Patent No. 1658042, filed on Aug. 30, 2016, and the priority benefit of French Application for Patent No. 1658043, filed on Aug. 30, 2016, the disclosures of which are hereby incorporated by reference in their entireties.

TECHNICAL FIELD

The present disclosure relates to field-effect transistors, in particular to all-around gate field-effect transistors, and to a method of forming such transistors.

BACKGROUND

The article by L Gaben et al. "Evaluation of Stacked Nanowires Transistors for CMOS: Performance and Technology Opportunities," ECS Transactions, Vol. 72. No. 4, 2016, page 43, describes a method of forming two all-around gate transistors by a sacrificial gate method where the silicon channels are formed before the gate manufacturing. FIGS. 1A to 1G and 2A illustrate steps of the method described in the Gaben et al. article. FIGS. 1A, 1C, and 1E to 1G are cross-section views. FIGS. 1B and 1D are perspective cross-section views. FIG. 2A is a top view of the structure of FIG. 1A.

At the step of FIGS. 1A and 2A, a substrate 1 is successively covered with a silicon-germanium layer 3, with a silicon layer 5, with a SiGe layer 7, and with a silicon layer 9. Layers 3, 5, 7, and 9 are then etched in a strip 11 illustrated in FIG. 2A. Strip 11 extends between two pads 13 and 15 and has a width smaller than that of pads 13 and 15. After this, a wet selective etching of SiGe is carried out. The etching time is provided, on the one hand, to remove all the SiGe between silicon bars 17 and 19 extending between pads 13 and 15 and, on the other hand, to keep a portion 25 of SiGe layer 3 and a portion 27 of SiGe layer 7 in each pad. Bars 17 and 19 are thus suspended above substrate 1 and held by pads 13 and 15.

At the step of FIG. 1B, it is started by depositing a hydrogen silsesquioxane (HSQ) resin. The layer covers the structure and fills the space between bars 17 and 19 and under lower bar 17. A lithography of this layer is then carried out, to obtain two sacrificial gates 30. Each sacrificial gate 30 extends vertically from the substrate while surrounding a portion of each of bars 17 and 19. To achieve this, the portions of HSQ resin corresponding to sacrificial gates 30 are subjected to an ultraviolet radiation or to an electron beam running through bars 17 and 19, and are turned into silicon oxide.

At the step of FIG. 1C, an insulating layer has been conformally deposited. The material of this layer fills spaces 32 between bars 17 and 19 and between substrate 1 and bar 17. A selective anisotropic etching is then performed to remove the portions of this layer which are horizontal and non-covered. Spacers 34 are thus kept on the sides of each sacrificial gate 30 and the portions of the material filling spaces 32 are kept.

At the step of FIG. 1D, all the elements located on substrate 1 are removed by etching, except for sacrificial gates 30, spacers 34, and the elements covered with sacrificial gates 30 and with spacers 34. The remaining portions of bars 17 and 19 are the future channel regions, respectively 40 and 41, of the transistors. On either side of each of sacrificial gates 30, insulating portions 34' which continue spacers 34 between channel regions 40 and 41 and between regions 40 and the substrate have thus been formed. Each sacrificial gate 30 and the spacers 34, 34' on its sides are thus crossed by channel regions 40 and 41. Channel regions 40 and 41 come up to the sides of spacers 34, 34'.

At the step of FIG. 1E, a selective epitaxy is performed. The silicon grows from the exposed portions of channel regions 40 and 41 as well as from substrate 1. Two drain-source areas 42 on either side of the two sacrificial gates 30 and a drain-source area 44 between the sacrificial gates are thus formed. The obtained drain-source areas 42 and 44 rest on substrate 1.

At the step of FIG. 1F, sacrificial gates 30 are entirely removed by selective wet etching. The portions of sacrificial gates 30 located between regions 40 and 41 and under region 40 are removed. Channel regions 40 and 41 are then suspended above substrate 1.

At the step of FIG. 1G, insulated gates 50 are formed at the locations of the sacrificial gates. To achieve this, a gate insulator layer 52 of high permittivity which covers the portions of substrate 1 and channel regions 40 and 41 located at these locations is first deposited. The rest of the locations of the sacrificial gates are then filled with a conductive material forming gates 50.

Two transistors, each comprising two channel regions 40 and 41 surrounded with an insulated gate 50 and two drain-source areas 42 and 44 on either side of insulated gate 50, have thus been obtained. At a subsequent step, drain or source contacts 56 with areas 42, a drain or source contact 57 with area 44, and gate contacts 58, are formed.

In transistors obtained by the method previously described in relation with FIGS. 1A to 1G, the drain-source areas rest, at least partly, directly on the substrate. When the substrate is a solid semiconductor, conduction may occur through the substrate between the drain-source areas. To limit the conduction of this parasitic channel, it may be provided for a portion of the substrate located under the suspended channels to be doped with a conductivity type different from that of the drain-source areas to increase the threshold voltage of the parasitic transistor. Despite this precaution, when a gate voltage is applied to one of the transistors between contact 58 and contact 56 or 57 to turn on the transistor, leakage currents may flow through the substrate portion located under insulated gate 50.

The transistors thus obtained raise various operation issues when substrate 1 is a solid semiconductor material, called "bulk", and more generally when substrate 1 is not covered with a layer of insulator such as the insulator of a SOI-type structure (Silicon On Insulator).

There is according a need in the art to address the foregoing concerns.

SUMMARY

An embodiment provides an all-around gate field-effect transistor, arranged above a solid semiconductor substrate, that comprises, between two drain-source areas resting on the substrate, at least one channel region surrounded with a gate insulated by a gate insulator, the channel region being located above an insulating layer resting on the substrate between the drain-source areas, the insulating layer having a thickness-to-permittivity ratio at least 2 times greater than that of the gate insulator.

According to an embodiment, the insulating layer is made of silicon oxide derived from HSQ resin.

According to an embodiment, the insulating layer has a thickness greater than 1 nm.

According to an embodiment, the channel region is made of silicon or of silicon-germanium.

According to an embodiment, the gate has a length in the range from 7 to 20 nm, and the channel region has a thickness in the range from 3 to 7 nm and extends in the gate width direction across from 7 to 100 nm.

An embodiment provides an electronic chip comprising at least one transistor such as hereabove.

An embodiment provides a method of manufacturing an all-around gate field-effect transistor, comprising: a) forming two drain-source areas on a solid semiconductor substrate, the two areas being connected by at least one channel region suspended above the substrate; b) forming on the substrate a sacrificial gate made of an insulating material surrounding the channel region; c) removing the sacrificial gate except for an insulating layer located under the channel region; and d) forming an insulated gate at the location of the portion removed at step c), the insulating layer having a thickness-to-permittivity ratio at least 2 times greater than that of the gate insulator.

According to an embodiment, the sacrificial gate is made of silicon oxide derived from HSQ resin.

According to an embodiment, step b) takes place before step a).

According to an embodiment, the insulating layer has a thickness greater than 10 nm.

According to an embodiment, the channel region is made of silicon or of silicon-germanium.

According to an embodiment, the sacrificial gate has a length in the range from 1 nm to 1 µm, and the channel region has a thickness in the range from 1 to 15 nm and extends in the gate width direction across from 1 nm to 1 µm.

An embodiment provides a field-effect transistor arranged above a solid semiconductor substrate, that comprises two drain-source areas connected by at least one semiconductor region surrounded with an insulated gate, the insulated gate being separated by less than 40 nm from another insulated gate surrounding another semiconductor region, said semiconductor regions being located above an insulating region extending on the substrate, the insulating region being made of a silicon oxide resulting from the transformation of HSQ, one at least of the drain-source areas being entirely located on the insulating region and between the insulated gates.

According to an embodiment, the insulating region comprises an area of minimum thickness under said at least one on the drain-source areas, this minimum thickness being in the range from 10 to 20 nm.

According to an embodiment, the insulating region comprises a portion located between the two drain-source areas.

According to an embodiment, the insulated gate has a length in the range from 7 to 20 nm, and the semiconductor region has a thickness in the range from 3 to 7 nm and extends in the gate width direction across a width in the range from 7 to 100 nm.

An embodiment provides a method of manufacturing an all-around gate field-effect transistor, comprising: a) forming at least one semiconductor bar suspended above a semiconductor substrate; b) forming on the substrate, by lithographic etching of a HSQ layer, at least two sacrificial gates distant by less than 40 nm and crossed by the bar, so that an insulating bottom remains on the substrate between the sacrificial gates, the bar running above the insulating bottom; c) growing two drain-source areas on either side of one of the sacrificial gates by epitaxy from apparent portions of the bar, one at least of the drain-source areas resting on the insulating bottom; d) removing the sacrificial gates except for lower portions located under the bar; and e) forming insulated gates at the locations of the portions removed at step d).

According to an embodiment, at step b), the sacrificial gates have a height greater than 100 nm.

According to an embodiment, the insulating bottom comprises an area of minimum thickness, this minimum thickness being in the range from 10 to 20 nm.

According to an embodiment, the lower portions have a thickness greater than 10 nm.

According to an embodiment, the semiconductor bar is made of silicon or of silicon-germanium.

According to an embodiment, the sacrificial gate has a length in the range from 7 to 20 nm, and the semiconductor bar has a thickness in the range from 3 to 7 nm and extends in the gate width direction across a width in the range from 7 to 100 nm.

An embodiment provides an electronic chip comprising at least one transistor such as hereabove.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1A:
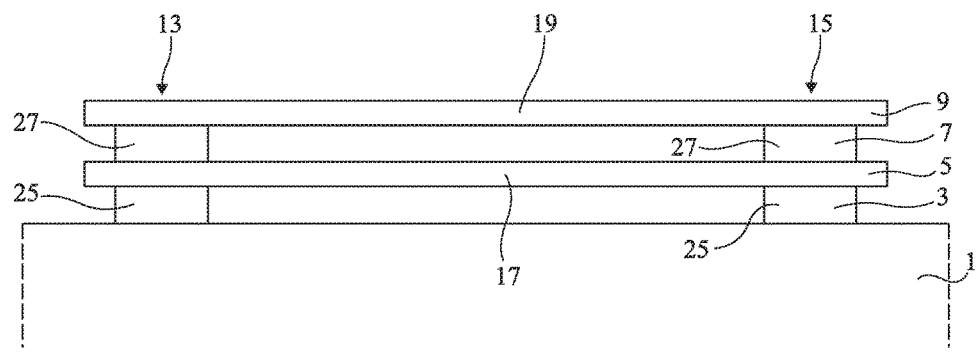
FIGS. 1A, 2A, and 1B to 1G illustrate steps of a method of manufacturing all-around gate field-effect transistors.
Figure 2A:
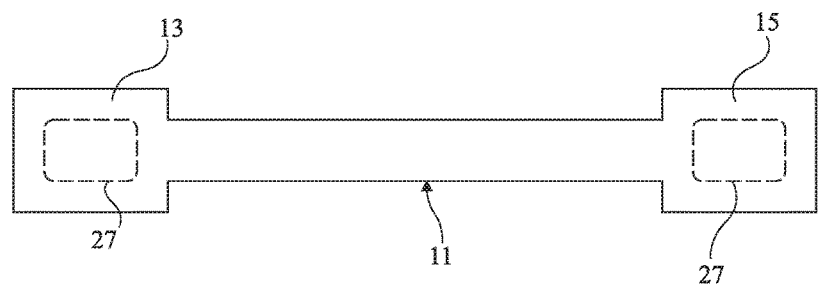
Figure 1B:
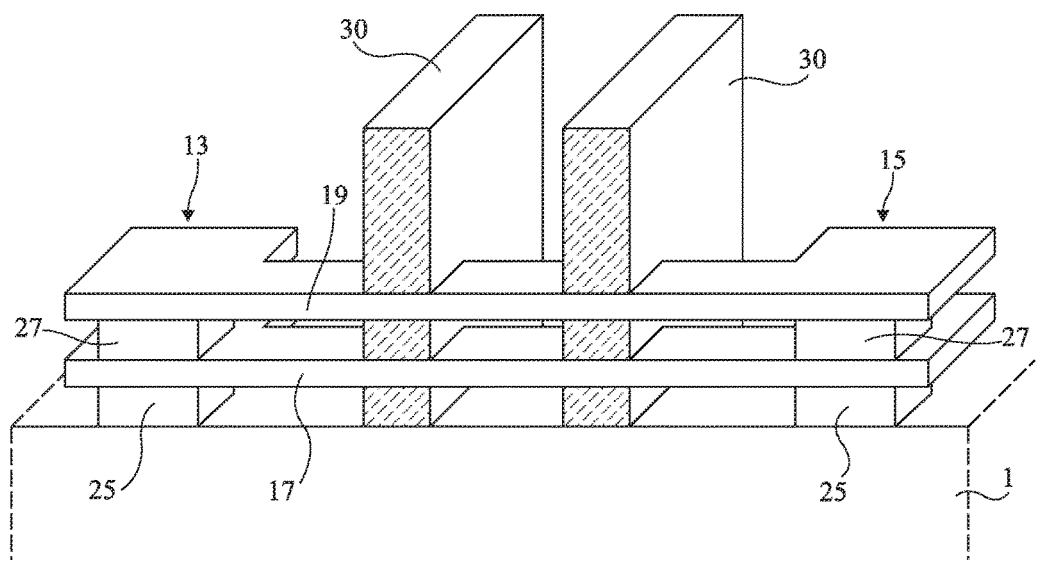

For clarity, the same elements have been designated with the same reference numerals in the various drawings and, further, the various drawings are not to scale. For clarity, only those steps and elements which are useful to the understanding of the described embodiments have been shown and are detailed. In particular, protection and masking layers used during steps of deposition and etching are not shown.

In the following description, when reference is made to terms qualifying position, such as terms "top", "bottom", "upper", "lower", etc., or terms qualifying orientation such as terms "horizontal", "vertical", etc., reference is made to the orientation of the concerned element in the concerned drawings.

A method, described hereafter, enables a suppression of, or at least a further decrease in, leakage currents that flow through the substrate portion located under insulated gate 50. To achieve this, it is provided to increase the thickness of the insulation between insulated gates 50 and substrate 1 by adding an insulating layer between the gate and the substrate. The equivalent oxide thickness of the parasitic channel thus takes into account insulator 52 of a thickness in the order of one nanometer as well as the thickness of the insulator added to increase its threshold voltage and to decrease, or even annihilate, any parasitic conduction.

Figure 3A:
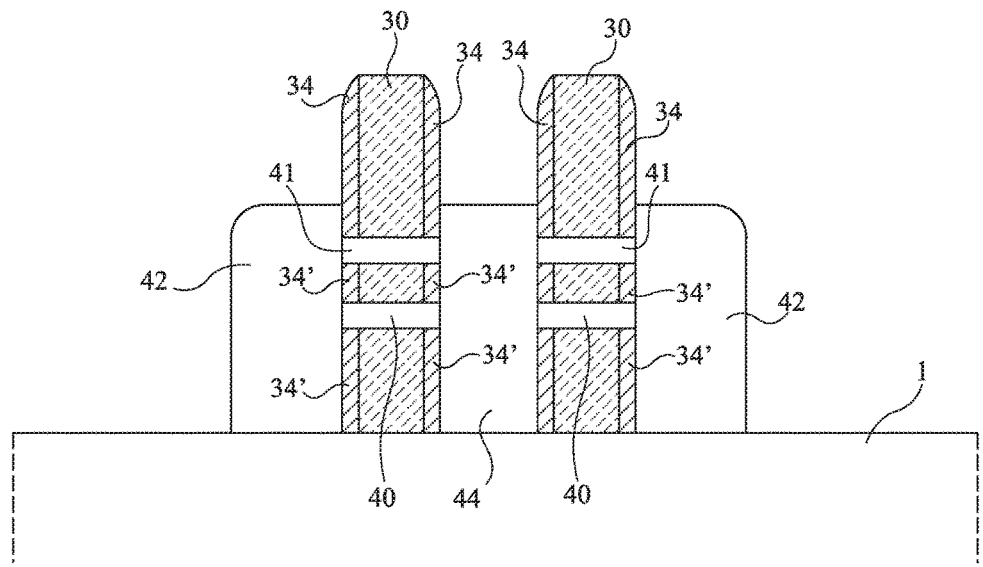
FIGS. 3A to 3C illustrate steps of an embodiment of a method of manufacturing all-around gate field-effect transistors.
Figure 3B:
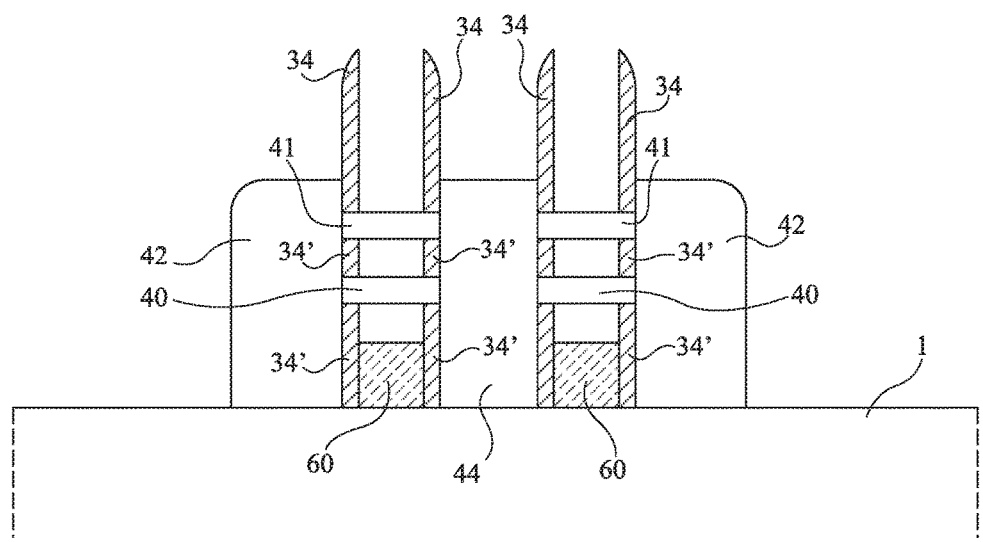
Figure 3C:
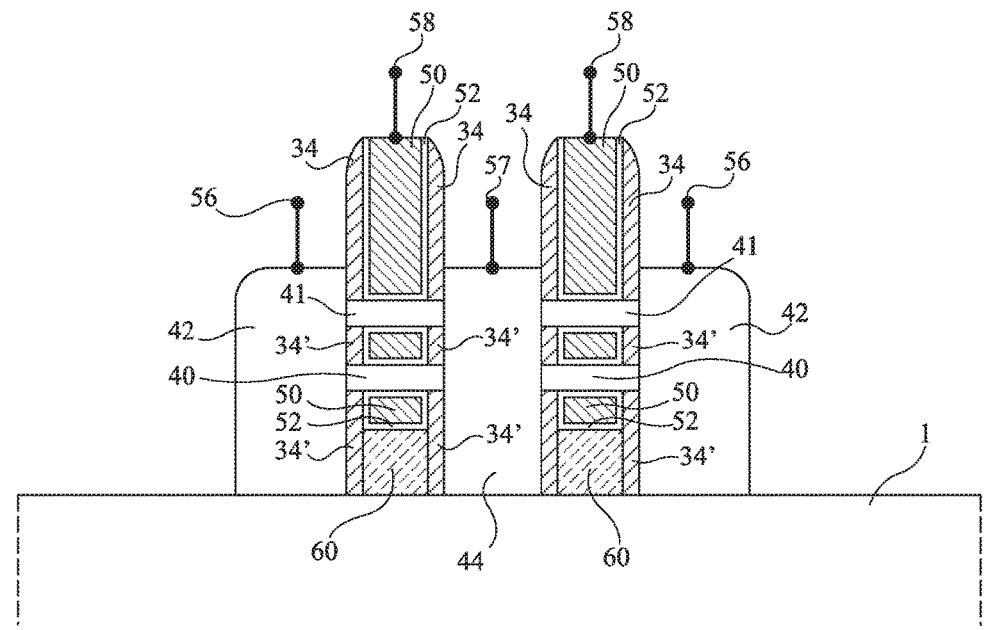

FIGS. 3A to 3C are simplified cross-section views illustrating steps of an embodiment of a method of manufacturing all-around gate field-effect transistors. As an example, the forming of two transistors in series, only provided with two suspended conduction channels, is illustrated.

Figure 1C:
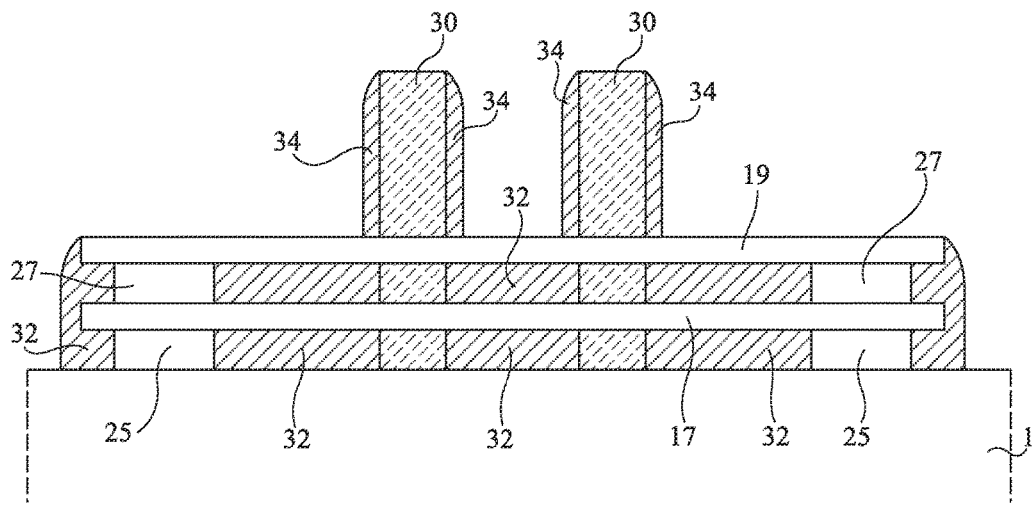
Figure 1D:
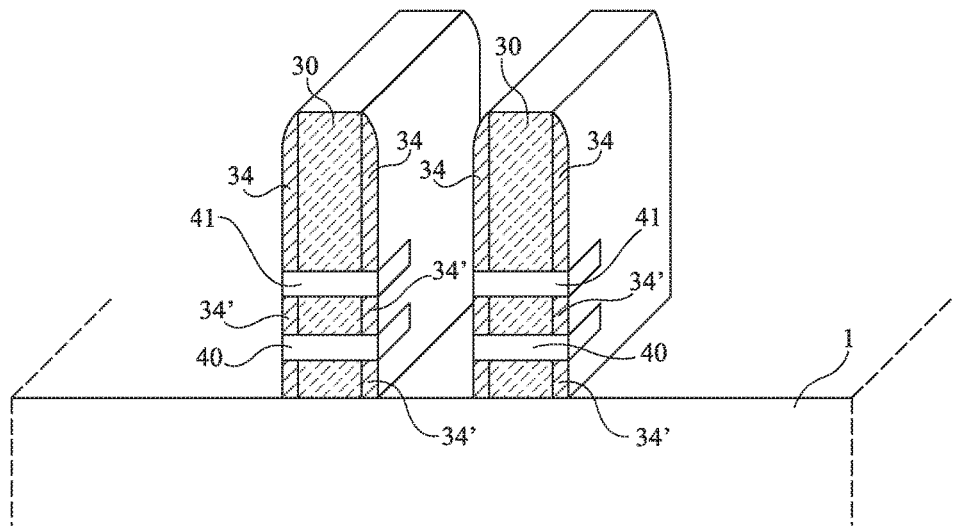
Figure 1E:
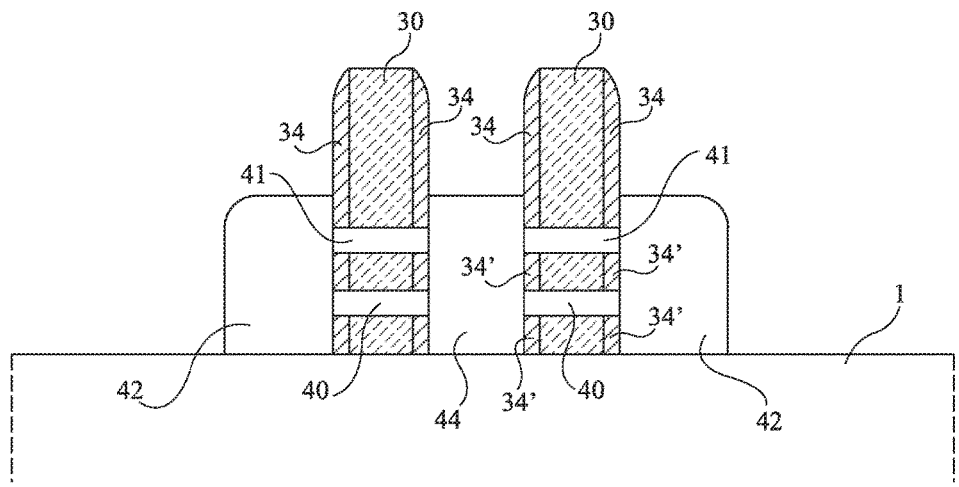
Figure 1F:
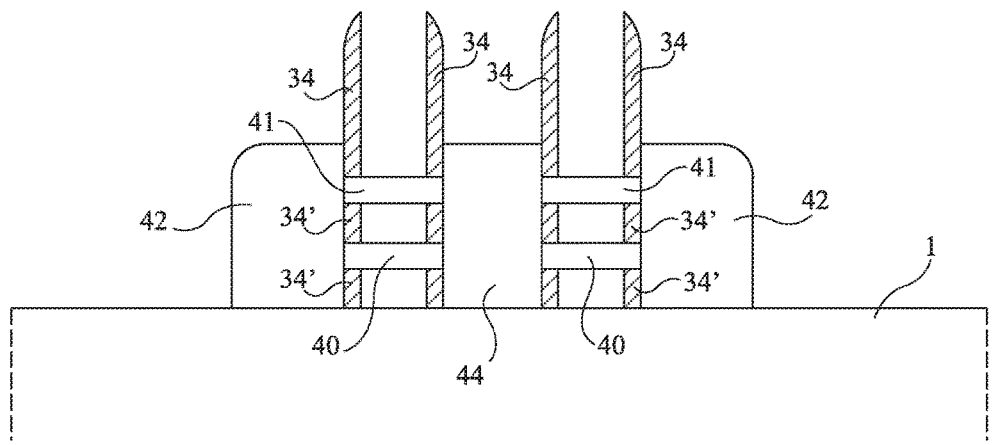

At the step of FIG. 3A, a structure similar to that of FIG. 1E, that is, corresponding to a step preceding the sacrificial gate removal, has been formed. This structure comprises, on a solid semiconductor substrate 1, for example, made of silicon, two sacrificial gates 30 made of an insulating material such as a silicon oxide, for example, derived from HSQ resin. The sides of each sacrificial gate 30 are covered with spacers 34, 34', for example, made of silicon nitride. Each sacrificial gate and the spacers on its sides are crossed by a channel region 40 and are for example also crossed by a channel region 41 located above channel region 40. Channel regions 40 and 41 are in contact with a drain-source area arranged between sacrificial gates 30 and with two drain-source areas 42 located on either side of sacrificial gates 30.

As an example, the structure of FIG. 3A may be obtained by implementing steps similar to those previously-described in relation with FIGS. 1D-1E. The structure of FIG. 3A may also be obtained in another way, for example, by implementing steps of a method where sacrificial gates are made of a material such as polysilicon. Such a method is described in the above-mentioned Gaben article. One may then, before the step of FIG. 3A, entirely remove the sacrificial gates by selective isotropic etching. Sacrificial gates 30 may be formed by first filling the locations of the sacrificial gates with an insulating material, for example, a HSQ resin or any other deposited oxide capable of being selectively etched over spacers 34 and 34' and channels 40 and 41. In the case of the use of a flowing oxide such as HSQ resin, a densifying anneal or an exposure of the resin to an ultraviolet radiation or to an electron beam may be necessary. The structure of FIG. 3A is thus obtained. Sacrificial gates 30 may be made of other insulating materials, satisfying the property of selective etching over the material forming spacers 34 and 34', for example, made of silicon oxide which does not derive from HSQ resin.

As an example, each sacrificial gate 30 extends laterally along a gate length in the range from 2 to 50 nm, for example, from 7 to 20 nm, for example, 10 nm. Sacrificial gates 30 may be separated by a distance shorter than 100 nm. Spacers 34, 34' may have a thickness in the range from 1 to 20 nm, for example, from 3 to 7 nm, for example, 5 nm. Channel regions 40 and 41 may be separated by a height in the range from 5 to 20 nm. Channel regions 40 and 41 may have a thickness in the range from 1 to 20 nm, for example, from 3 to 7 nm. The channel regions may have, in the gate width direction (orthogonally to the plane of the drawing), a width in the range from 1 nm to 1 μm, for example, from 7 to 100 nm.

At the step of FIG. 3B, the sacrificial gates 30 are removed, except for portions of a lower insulating layer 60 located under channel regions 40. As an example, this partial removal step may be carried out by a selective wet etching having an adapted duration. During this etching, channel regions 41 and then 40 are successively disengaged across their entire width and are then suspended.

Insulating layer portions 60 entirely cover the substrate portions located under the suspended channel regions. The height separating channel regions 40 of substrate 1 has been selected to be sufficiently high to enable to totally expose channel regions 40 along their entire width while leaving in place a sufficient thickness of the portions of insulating layer 60. This thickness is for example greater than 10 nm.

In the example described herein, the HSQ resin has been transformed into a silicon oxide of low density, which provides insulating layer 60 with a low dielectric permittivity, for example, a relative permittivity lower than 3.

At the step of FIG. 3C, insulated gates 50 are formed at the locations of the removed portions of sacrificial gates 30. Gates 50 may be metallic. Each gate 50 is insulated by a gate insulator layer 52, for example, of high permittivity, for example, a hafnium oxide layer. Gate insulator layer 52 may have a thickness smaller than 3 nm. Drain and source contacts 56 and 57 and gate contacts 58 are then formed.

Figure 1G:
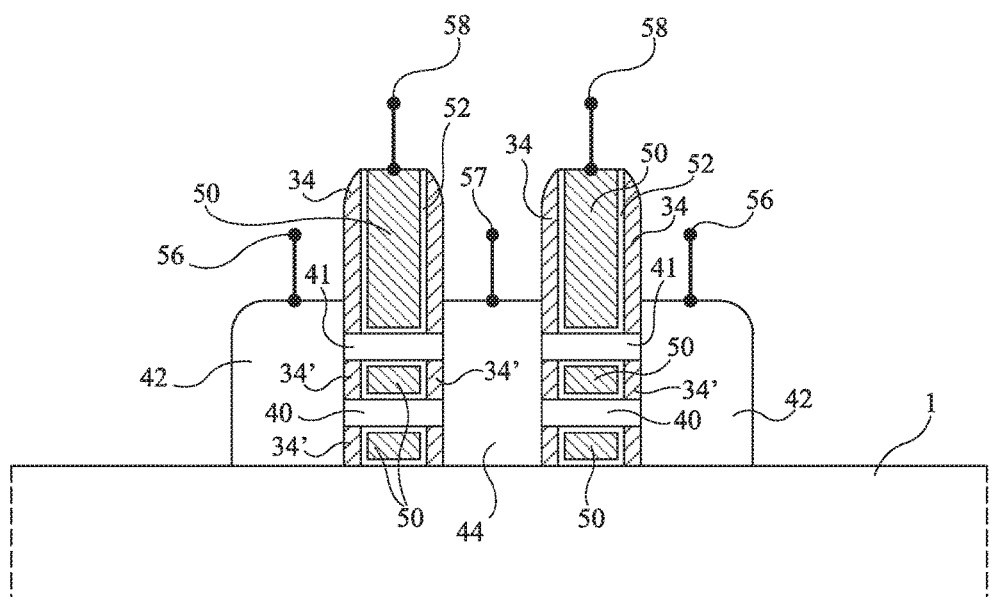

Each of the two obtained transistors comprises the same elements as those of the transistors previously described in relation with FIG. 1G, that is, two channel regions 40 and 41 surrounded with an insulated gate 50, and two drain-source areas 42 and 44 on either side of insulated gate 50. Unlike the transistors of FIG. 1G, each insulated gate 50 of the transistors of FIG. 3C is separated from substrate 1 not only by gate insulator layer 52, but also by insulating layer 60. When one of the transistors is made conductive by application of a gate voltage, insulating layer 60 limits the influence of this voltage on the conduction in the substrate, all the more as insulating layer 60 is thick and is made of a material of low permittivity. The ratio between the thickness and the permittivity of layer 60 is high, for example, more than 2 times greater than the ratio of the thickness to the permittivity of gate insulator layer 52. Thereby, leakage currents in the substrate between the drain-source areas are particularly decreased or suppressed. This also enables to strongly limit the capacitive coupling between gate 50 and substrate 1.

In transistors obtained by the method described hereabove in relation with FIGS. 3A to 3C, the drain-source areas are directly in contact with the semiconductor substrate. Thereby, when the drain-source areas of such a transistor are close to each other, for example, distant by less than 20 nm, a residual parasitic conduction may remain in the substrate between the drain-source areas, independently from the state, off or on, of the transistor.

To solve this disadvantage, a method, described hereafter, enabling to suppress such a parasitic conduction of the drain-source areas, is provided.

FIGS. 4A to 4D are cross-section views illustrating steps of an example of a method of manufacturing insulated all-around gate field-effect transistors. As an example, the forming of two transistors in series has been illustrated.

Figure 4A:
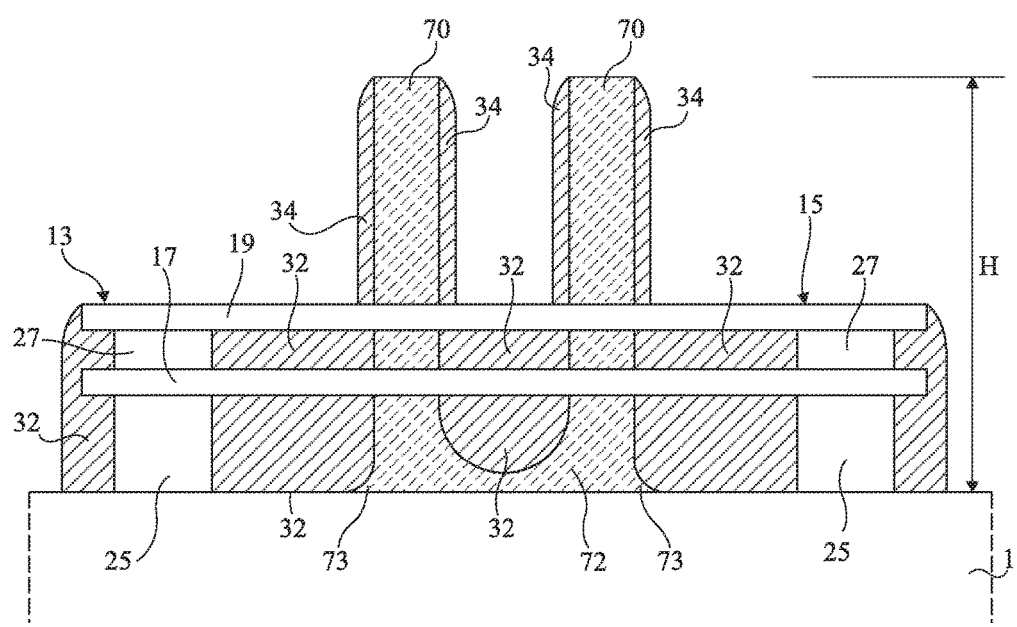
FIGS. 4A to 4D illustrate steps of another embodiment of a method of manufacturing all-around gate field-effect transistors.

At the step of FIG. 4A, from a structure comprising two bars 17 and 19 suspended by pads 13 and 15 above a solid semiconductor substrate 1, two sacrificial gates 70 are formed. Each sacrificial gate 70 surrounds a portion of each of bars 17 and 19, this portion having a length for example in the range from 1 to 15 nm.

The sacrificial gates are separated by a small distance, for example, a distance D shorter than 50 nm, and rise up from the substrate along a large height, for example, a height H greater than 100 nm. Further, the sacrificial gates are obtained by lithography of a HSQ resin layer through the silicon channels, for example, by exposure to an ultraviolet radiation with an energy in the range from 100 to 2,000 μC/cm². Distance D between two neighboring sacrificial gates and height H of these sacrificial gates are selected so that the lower portions of the sacrificial gates are connected by an insulating bottom 72 which remains on the substrate. The insulating bottom is made of silicon oxide derived from the transformed HSQ resin. In a central portion of the insulating bottom, the thickness of the insulating bottom reaches a value in the range from 1 to 20 nm, preferably from 10 to 20 nm. This insulating bottom may also be obtained between sacrificial gates having a height smaller than 100 nm, or for sacrificial gates more distant than 40 nm, by varying the resin exposure and development parameters. It should be noted that there generally also remain, outside of the sacrificial gates, feet 73 made of silicon oxide derived from HSQ resin.

The height of bar 17 above the substrate has been selected to be sufficiently high for the obtained insulating bottom to be located under the lower level of bar 17. After the forming of sacrificial gates 70 and of insulating bottom 72, spacers 34 are formed in the same way as at the previously-described step of FIG. 1C, that is, by conformal deposition of an insulating layer, for example, made of silicon nitride, followed by an anisotropic etching of this layer. The silicon nitride then fills the spaces 32 left free between bars 17 and 19 and under bars 17.

Figure 4B:
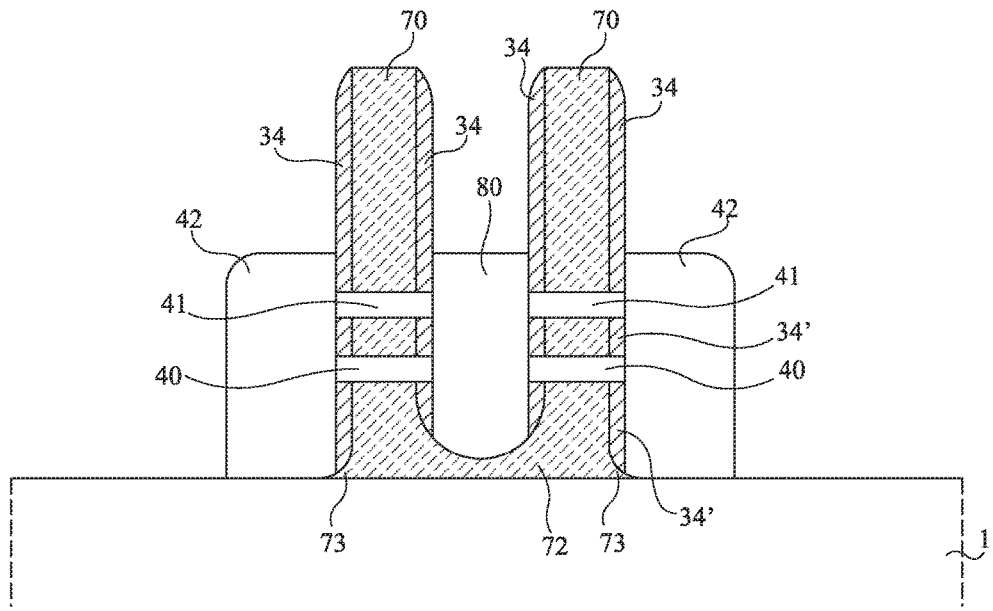

At the step of FIG. 4B, it is started by removing by selective etching 1) all the elements located on the substrate, except for the sacrificial gates, spacers 34, insulating bottom 72, and all the portions covered with the sacrificial gates or with spacers 34, 2) all the previously-mentioned elements, except for a minimum portion of channel 17 to be able to grow by epitaxy the doped silicon or silicon germanium sources and drains on this horizontal portion, or 3) the only portion of spacers 34 resting on the top of the stack (channel 19), the doping of the sources and drains being then only performed by implantation. Spacers 34 have thus been vertically continued in portions 34' while keeping insulating bottom 72. Channel regions 40 and 41 cross sacrificial gates 70 and spacers 34 and emerge on the spacer sides. Two drain-source areas 42 on either side of sacrificial gates 70, and a source-drain area 80 between the sacrificial gates are then grown by epitaxy, from channel regions 40 and 41. Drain-source area 80 is separated from the substrate by insulating bottom 72.

Figure 4C:
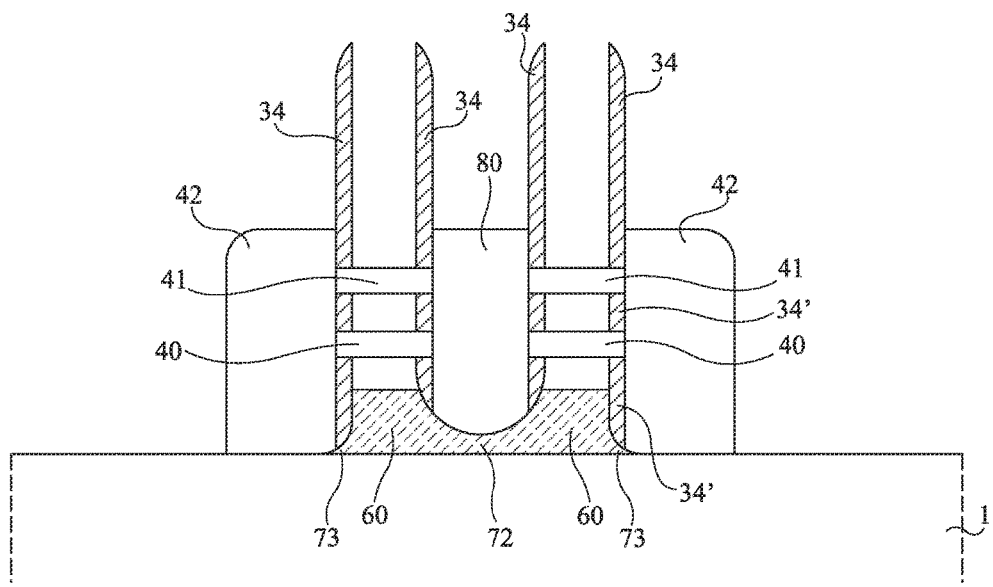

At the step of FIG. 4C, the sacrificial gates are removed, except for lower insulating portions 60 located on the substrate under channel regions 40 and gates assumed to remain inactive (dummy gates).

Figure 4D:
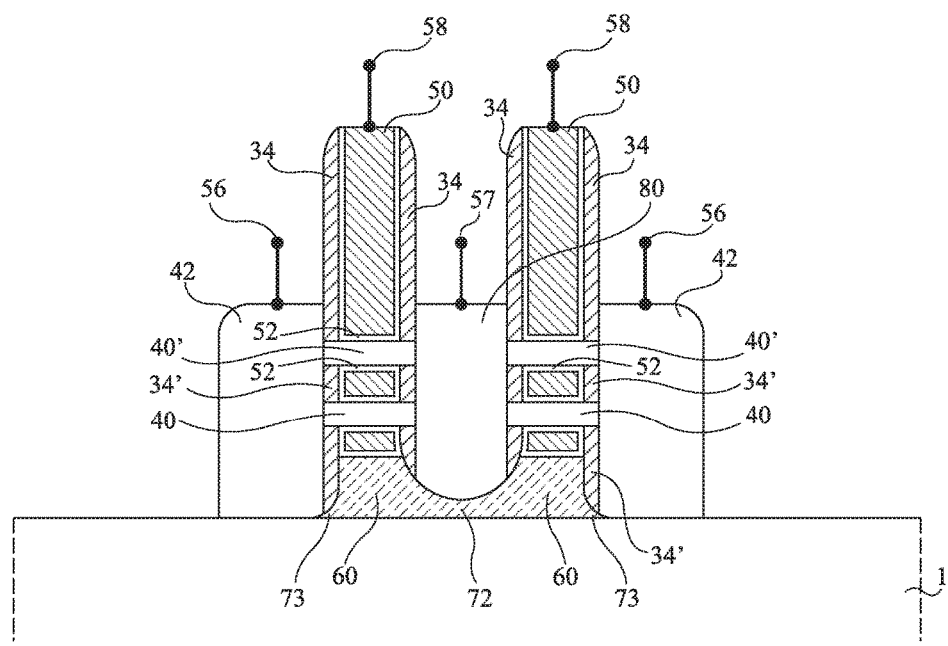

At the step of FIG. 4D, insulated gates 50 are formed at the locations of the removed portions of sacrificial gates 70. Each gate 50, for example, metallic, is insulated by a gate insulator layer 52. Drain-source contacts 56 on areas 42, a drain-source contact 57 on area 80, and gate contacts 58 are formed.

Two transistors, each comprising two channel regions 40 and 41 surrounded with an insulated gate 50 and two drain-source areas 42 and 80 located on either side of the channel regions. For the two obtained transistors, due to the presence of insulating bottom 72 between drain-source area 80 and the substrate, no parasitic current can flow in the substrate between drain-source areas 80 and 42. Further, the provision under drain-source area 80 of an insulating layer made of a silicon oxide of low permittivity for example derived from HSQ resin enables to limit the parasitic capacitive coupling between drain-source area 80 and substrate 1.

Specific embodiments have been described. Various alterations, modifications, and improvements will occur to those skilled in the art. In particular, although two transistors are formed in the above-described methods, a single transistor, or three or more transistors may be formed by similar methods.

Although, in the above-described embodiments, the obtained transistors each comprise two stacked channel regions 40 and 41, transistors each comprising a single channel region or comprising three or more channel regions may be similarly obtained. To achieve this, the corresponding number of suspended bars may be formed above the substrate before forming sacrificial gates.

Examples of above-described methods comprise, as mentioned, a step of epitaxy of the drain-source areas preceded by a step of etching elements non-covered with the sacrificial gates or with the spacers. At this etch step, in the described examples, the portions of the semiconductor bars located outside of the channel regions are removed. However, only the elements located above a level located in the bar closest to the substrate can be removed. Part of the bar is thus disengaged. The drain-source regions may grow from the bar during the subsequent epitaxy step.

Although, in the above-described embodiments, the channel regions are made of silicon, channel regions made of other semiconductors, for example, silicon-germanium, may be similarly obtained.

In the foregoing, it has been indicated that drain-source area 80 is insulated in its lower portion by insulating region 72. However, drain and source areas 42 are not insulated from substrate 1, except by insulating feet 73, which do not totally extend under the drain and source regions. As a variation, inactive sacrificial gates (dummy gates) may be formed on either side of the structure illustrated in FIGS. 4A to 4D. Thus, one will find between the outside of each of sacrificial gates 70 and the dummy gates an insulating region corresponding to insulating region 72. This insulating region will provide the insulation between drain and source 42 and the underlying substrate 1.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing an all-around gate field-effect transistor, comprising:
    a) forming two drain-source areas supported by a semiconductor substrate, the two areas being connected by at least one channel region suspended above the semiconductor substrate;
    b) forming on the semiconductor substrate a sacrificial gate made of an insulating material that surrounds the at least one channel region, wherein forming the sacrificial gate further comprises extending the sacrificial gate under at least one of said two drain-source areas so as to insulate said at least one of said two drain-source areas from the semiconductor substrate;
    c) removing the sacrificial gate except for an insulating layer located under the at least one channel region and the extended sacrificial gate under said at least one of said two drain-source areas; and
    d) forming an insulated gate with a gate insulator at a location where the sacrificial gate was removed at step c),
    wherein the insulating layer has a thickness-to-permittivity ratio at least 2 times greater than that of the gate insulator.

2. The method of claim 1, wherein the sacrificial gate is made of silicon oxide derived from HSQ resin.

3. The method of claim 1, wherein step b) takes place before step a).

4. The method of claim 1, wherein the insulating layer has a thickness greater than 10 nm.

5. The method of claim 1, wherein the channel region is made of a material selected from the group consisting of silicon and silicon-germanium.

6. The method of claim 1, wherein the sacrificial gate has a length in the range from 1 nm to 1 µm, and the channel region has a thickness in the range from 1 to 15 nm and extends in a gate width direction across from 1 nm to 1 µm.

7. A field-effect transistor, comprising:
a semiconductor substrate,
two drain-source areas,
at least one semiconductor channel region connecting the two drain-source areas,
an insulated gate surrounding the at least one semiconductor channel region,
wherein said insulated gate is separated by less than 40 nm from another insulated gate that surrounds another semiconductor channel region,
wherein said at least one semiconductor channel region is located above an insulating layer positioned on the semiconductor substrate and including an extension between the insulated gate and said another insulated gate to insulate at least one of said two drain-source areas from contacting the semiconductor substrate; and
wherein said at least one of said two drain-source areas is entirely located on the insulating layer and positioned between the insulated gate and said another insulated gate.

8. The transistor of claim 7, wherein the insulating layer and extension are made of a silicon oxide resulting from a transformation of HSQ.

9. The transistor of claim 7, wherein the extension comprises an area of minimum thickness under said at least one of the two drain-source areas, the minimum thickness being in a range from 10 to 20 nm.

10. The transistor of claim 9, wherein the insulating layer comprises a portion located between the two drain-source areas.

11. The transistor of claim 9, wherein the insulated gate has a length in a range from 7 to 20 nm, and the at least one semiconductor channel region has a thickness in a range from 3 to 7 nm and extends in a gate width direction across a width in a range from 7 to 100 nm.

12. The transistor of claim 7, wherein the transistor is a component of an electronic integrated circuit chip.

13. A method of manufacturing an all-around gate field-effect transistor, comprising:
a) forming at least one semiconductor bar suspended above a semiconductor substrate;
b) forming on the semiconductor substrate, by lithographic etching of an HSQ layer, at least two sacrificial gates separated by less than 40 nm and crossed by the at least one semiconductor bar, so that an insulating bottom remains on the substrate between the at least two sacrificial gates, the at least one semiconductor bar running above the insulating bottom;
c) growing two drain-source areas on either side of at least one of the at least two sacrificial gates by epitaxy from portions of the at least one semiconductor bar, wherein at least one of the two drain-source areas is positioned on the insulating bottom and insulated from the semiconductor substrate by the insulating bottom;
d) removing the sacrificial gates except for lower portions located under the at least one semiconductor bar; and
e) forming insulated gates at locations where the sacrificial gates were removed at step d).

14. The method of claim 13, wherein, at step b), the sacrificial gates have a height greater than 100 nm.

15. The method of claim 13, wherein the insulating bottom comprises an area of minimum thickness, this minimum thickness being in a range from 10 to 20 nm.

16. The method of claim 13, wherein said lower portions have a thickness greater than 10 nm.

17. The method of claim 13, wherein the at least one semiconductor bar is made of a material selected from the group consisting of silicon and silicon-germanium.

18. The method of claim 13, wherein the sacrificial gate has a length in a range from 7 to 20 nm, and the at least one semiconductor bar has a thickness in the range from 3 to 7 nm and extends in a gate width direction across a width in a range from 7 to 100 nm.

19. A field-effect transistor, comprising:
a semiconductor substrate;
a first drain-source area;
a second drain-source area;
a third drain-source area;
a first semiconductor channel region connecting the first and second drain-source areas;
a second semiconductor channel region connecting the second and third drain-source areas;
a first insulated gate surrounding the first semiconductor channel region;
a second insulated gate surrounding the second semiconductor channel region;
wherein said first and second semiconductor channel regions are located above an insulating region that is positioned on the semiconductor substrate and includes an extension between the first insulated gate and the second insulated gate to insulate the second drain-source area from contacting the semiconductor substrate, said second drain-source area being entirely located on the extension of the insulating region and positioned between the first and second insulated gates.

20. The transistor of claim 19, wherein the insulating region is made of a silicon oxide resulting from a transformation of HSQ.

21. The transistor of claim 19, wherein the extension comprises an area of minimum thickness under the second drain-source area, the minimum thickness being in a range from 10 to 20 nm.

22. The transistor of claim 21, wherein the insulating region comprises a portion located between the first and second drain-source areas and a portion located between the second and third drain-source areas.

23. The transistor of claim 21, wherein the insulated gate has a length in a range from 7 to 20 nm, each of the first and second semiconductor channel regions has a thickness in a range from 3 to 7 nm and extends in a gate width direction across a width in a range from 7 to 100 nm.

24. The transistor of claim 19, wherein the transistor is a component of an electronic integrated circuit chip.

25. A method of manufacturing an all-around gate field-effect transistor, comprising:
a) forming at least one semiconductor bar suspended above a semiconductor substrate;
b) forming on the semiconductor substrate, by lithographic etching of a sacrificial material layer, at least two sacrificial gates separated from each other and crossed by the at least one semiconductor bar, so that an insulating bottom remains on the substrate between the at least two sacrificial gates, the at least one semiconductor bar running above the insulating bottom;
c) growing two drain-source areas on either side of at least one of the at least two sacrificial gates by epitaxy from portions of the at least one semiconductor bar, wherein at least one of the two drain-source areas is positioned on the insulating bottom and insulated from the semiconductor substrate by the insulating bottom;

d) removing the sacrificial gates except for lower portions located under the at least one semiconductor bar; and e) forming insulated gates at locations where the sacrificial gates were removed at step d).

26. The method of claim 25, wherein the at least one semiconductor bar is made of a material selected from the group consisting of silicon and silicon-germanium.

* * * * *